United States Patent
Ehm et al.

(10) Patent No.: US 8,382,301 B2
(45) Date of Patent: Feb. 26, 2013

(54) OPTICAL ARRANGEMENT, IN PARTICULAR PROJECTION EXPOSURE APPARATUS FOR EUV LITHOGRAPHY, AS WELL AS REFLECTIVE OPTICAL ELEMENT WITH REDUCED CONTAMINATION

(75) Inventors: Dirk Heinrich Ehm, Lauchheim (DE); Stephan Muellender, Aalen (DE); Thomas Stein, Oberkochen (DE); Johannes Hubertus Josephina Moors, Helmond (NL); Bastiaan Theodoor Wolschrijn, Abcoude (NL); Dieter Kraus, Oberkochen (DE); Richard Versluis, Delft (NL); Marcus Gerhardus Hendrikus Meijerink, Den Haag (NL)

(73) Assignees: Carl Zeiss SMT GmbH, Oberkochen (DE); ASML Netherlands B.V., Veldhoven (NL)

( * ) Notice: Subject to any disclaimer, the term of this patent is extended or adjusted under 35 U.S.C. 154(b) by 30 days.

(21) Appl. No.: 12/403,233

(22) Filed: Mar. 12, 2009

(65) Prior Publication Data
US 2009/0231707 A1 Sep. 17, 2009

Related U.S. Application Data

(63) Continuation of application No. PCT/EP2007/008113, filed on Sep. 18, 2007.

(30) Foreign Application Priority Data

Sep. 19, 2006 (DE) .......................... 10 2006 044 591

(51) Int. Cl.
*G02B 5/08* (2006.01)
*H01S 3/22* (2006.01)

(52) U.S. Cl. .............................. 359/850; 372/58; 372/59
(58) Field of Classification Search ................... 359/850
See application file for complete search history.

(56) References Cited

U.S. PATENT DOCUMENTS
(Continued)

FOREIGN PATENT DOCUMENTS

| | | |
|---|---|---|
| CN | 1488068 A | 4/2004 |
| CN | 1639643 A | 7/2005 |

(Continued)

OTHER PUBLICATIONS

English translation of the second Office action of the Chinese Patent Office dated Apr. 27, 2012 issued in the parallel Chinese patent application No. 200780027669.8.

(Continued)

*Primary Examiner* — Jade R Chwasz
(74) *Attorney, Agent, or Firm* — Walter Ottesen P.A.

(57) ABSTRACT

An optical arrangement, e.g. a projection exposure apparatus (1) for EUV lithography, includes: a housing (2) enclosing an interior space (15); at least one, preferably reflective optical element (4-10, 12, 14.1-14.6) arranged in the housing (2); at least one vacuum generating unit (3) for the interior space (15) of the housing (2); and at least one vacuum housing (18, 18.1-18.10) arranged in the interior space (15) and enclosing at least the optical surface (17, 17.1, 17.2) of the optical element (4-10, 12, 14.1-14.5). A contamination reduction unit is associated with the vacuum housing (18.1-18.10) and reduces the partial pressure of contaminating substances, in particular of water and/or hydrocarbons, at least in close proximity to the optical surface (17, 17.1, 17.2) in relation to the partial pressure of the contaminating substances in the interior space (15).

34 Claims, 6 Drawing Sheets

U.S. PATENT DOCUMENTS

| | | | |
|---|---|---|---|
| 6,094,292 A * | 7/2000 | Goldner et al. | 359/265 |
| 6,984,475 B1 | 1/2006 | Levinson et al. | |
| 7,050,152 B2 | 5/2006 | Terashima et al. | |
| 7,196,769 B2 | 3/2007 | Miyajima | |
| 2002/0084425 A1 | 7/2002 | Klebanoff et al. | |
| 2002/0109826 A1 | 8/2002 | Akagawa et al. | |
| 2003/0051739 A1 | 3/2003 | Klebanoff et al. | |
| 2005/0030504 A1 | 2/2005 | Terashima et al. | |
| 2005/0104015 A1 | 5/2005 | Wedowski et al. | |
| 2005/0110966 A1 | 5/2005 | Hasegawa | |
| 2005/0275821 A1 | 12/2005 | Miyajima | |
| 2006/0001958 A1 | 1/2006 | Hasegawa | |
| 2006/0201848 A1 | 9/2006 | Lin et al. | |
| 2006/0209274 A1 | 9/2006 | To et al. | |
| 2011/0048452 A1 | 3/2011 | Zink et al. | |

FOREIGN PATENT DOCUMENTS

| | | |
|---|---|---|
| CN | 1791793 A | 6/2006 |
| DE | 10 2007 037 942 | 2/2009 |
| JP | 2004-327807 A | 11/2004 |
| JP | 2005101492 A | 4/2005 |
| WO | 02/44672 A2 | 6/2002 |
| WO | 2004-104707 A | 12/2004 |
| WO | 2004/104707 A2 | 12/2004 |
| WO | 2005091076 A2 | 9/2005 |

OTHER PUBLICATIONS

English translation of the Office action of the Japanese Patent Office dated Feb. 29, 2012 issued in the parallel Japanese patent application No. 2009-527752.

* cited by examiner

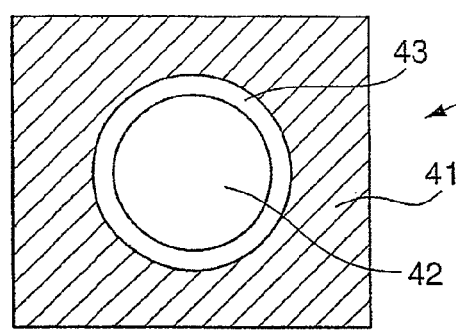
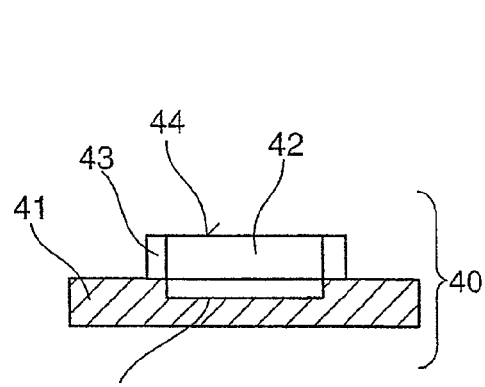
Fig. 5a
Fig. 5b
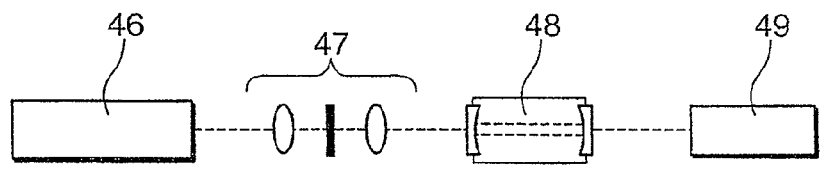
Fig. 6
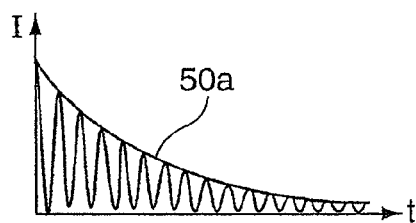
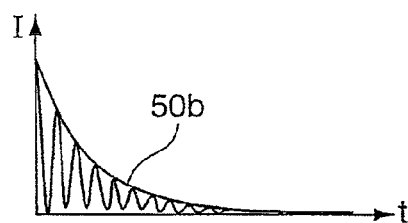
Fig. 7a
Fig. 7b

OPTICAL ARRANGEMENT, IN PARTICULAR PROJECTION EXPOSURE APPARATUS FOR EUV LITHOGRAPHY, AS WELL AS REFLECTIVE OPTICAL ELEMENT WITH REDUCED CONTAMINATION

CROSS-REFERENCE TO RELATED APPLICATIONS

This application is a Continuation of International Application PCT/EP2007/008113, with an international filing date of Sep. 18, 2007, which was published under PCT Article 21(2) in English, and the complete disclosure of which, including amendments, is incorporated into this application by reference. This application claims benefit under 35 U.S.C. §119(a) to German Patent Application No. 10 2006 044 591.0, filed on Sep. 19, 2006, the entire contents of which are hereby incorporated by reference.

BACKGROUND TO THE INVENTION

1. Field of the Invention

The invention relates to an optical arrangement, in particular a projection exposure apparatus for EUV lithography, comprising a housing that encloses an interior space; at least one, in particular reflective, optical element that is arranged in the housing, and at least one vacuum generating unit for generating a vacuum in the interior space of the housing. The invention further relates to a reflective optical element with a substrate and an electrically conductive multilayer system which on one of the sides facing the substrate comprises a reflective optical surface.

2. Background of the Invention

Optical arrangements in which optical elements are operated under vacuum conditions in an interior space of a housing are variously known. In EUV projection exposure apparatuses, typically, reflective elements, in particular mirrors, are used as optical elements, because at the wavelengths of approximately 13 nm as used in these applications no optical materials that provide adequate transmission are known. In such projection illumination instruments it is necessary to operate the mirrors in a vacuum because the service life of the multilayer mirrors is limited by contaminating particles or gases. To this effect it has been known to group the optical elements into three or more interconnected housing parts, which are divided by partition walls, namely a first housing part with a light source and a collector for focusing the illumination radiation, a second housing part with the illumination system, as well as a third housing part with the projection optics, the pressures within the housing parts being chosen to be different from each other, as described in detail in US 2005/0030504 A1, the entire contents of which are hereby incorporated by reference. In the context of this application, the term "housing" refers to both a housing of the EUV projection exposure apparatus overall, and to a partial region of the apparatus, in particular to one of the above-mentioned housing parts.

Such EUV projection exposure apparatuses or their individual housing parts are operated under vacuum conditions, wherein with the use of a dynamic gas lock (DGL) for reducing the outgassing products from the resist it is possible to achieve partial hydrogen pressures of $10^{-1}$ mbar and above, however usually (overall-) pressures of approximately $10^{-3}$ mbar and below are achieved. In the latter pressure region molecular movement is free, i.e. contaminating gases can propagate over the entire system. For this reason the achievable partial pressures of the contaminating gases are limited by all the components of the vacuum container, which components are present in the surroundings of the optical surfaces or further away from them. In the context of the present application, contaminating gases are defined as gases which are susceptible to form deposits on the optical surfaces, in particular when exposed to EUV-radiation. In this respect, non-volatile hydrocarbons having an atomic mass of 100 amu or above are treated to be contaminating substances, whereas volatile hydrocarbons in general having an atomic mass below 100 amu, e.g. methane ($CH_4$), usually stay volatile even when irradiated with EUV light and consequently do not form deposits on the optical surface.

It is known that all types of atoms, molecules and compounds have a certain probability of reaching the optical surfaces and of adhering there. Together with the radiated-in EUV light and the photoelectrons generated as a result of this, in particular secondary electrons, there is a certain probability of these atoms, molecules or compounds reacting with the optical surface, which leads to an increase in contamination, increased damage and associated loss of reflection of the mirrors, and thus overall to transmission loss of the optics. Furthermore, adhering molecules can detach themselves from surfaces (e.g. chamber walls etc.) as a result of temperature increase, light radiation or electron radiation. Furthermore, contamination can also deposit on the optical surfaces in that thereon an excess charge is generated by the photoelectrons, in particular secondary electrons, which excess charge attracts electrically charged contaminating particles.

It is also known to at least partially remove contaminating substances which adhere to the optical surface by bringing the optical surface into contact with a cleaning agent, in particular with a cleaning gas. In such a way, carbon contamination can be removed from the optical surfaces by using atomic hydrogen as a cleaning gas. However, due to the fact that atomic hydrogen is highly reactive not only to carbon but also to other substances (especially metals by forming metal hydrides) which are present in the environment of the optical surfaces, contaminants which are released by these components by the cleaning itself may adhere to the optical surface.

OBJECTS OF THE INVENTION

It is an object of the invention to provide an optical arrangement of the type mentioned in the introduction as well as a reflective optical element of the type mentioned in the introduction, in which the adherence of contamination is reduced.

SUMMARY OF THE INVENTION

According to a first aspect of the invention this object is met in that the optical arrangement comprises a vacuum housing that is arranged in the interior space of the housing and that encloses at least the optical surface of the optical element, wherein a contamination reduction unit is associated with the vacuum housing, which contamination reduction unit reduces the partial pressure of contaminating substances, in particular of water and/or hydrocarbons, at least in close proximity to the optical surface, in relation to the partial pressure of the contaminating substances in the interior space.

In the state of the art the individual optical surfaces are not separated from all other non-optical materials of the optical arrangement which can for example be comprised in EUV optics and in an associated lithography exposure apparatus, respectively. Thus, in that arrangement the vacuum conditions are not limited by the optical elements themselves but instead by all further components of the vacuum system. This arrangement is disadvantageous in particular in that most of the materials used in the vacuum environment are not bakeable, so that the absolutely achievable vacuum pressure in the housing is limited by the outgassing of these materials.

The invention thus proposes at least partial shielding of the optical surfaces from the non-optical materials that are present in the remaining interior space of the housing, namely by providing at least one additional vacuum housing in the interior space. On the other hand, the mere provision of partition walls for dividing the interior space does not in itself make it possible to separate the optical surfaces of non-optical elements that outgas contaminating substances, in particular if said optical elements are not bakeable. The additional vacuum housing is preferably placed on the optical element or on an associated mount, and encloses at least the region of the optical surface, wherein in particular a partial volume containing the optical element is separated from the interior space of the housing. Since the use of tiltable optical elements frequently occurs in EUV projection exposure apparatuses the vacuum housing is affixed such that either between the vacuum housing and the surface of the optical element if need be a very small gap of less than 5 mm, preferably less than 3 mm, particularly preferably less than 1 mm remains, which gap provides the necessary play for tilting the optical element, or in that location a flexible vacuum component (e.g. in particular a corrugated metal bellows) is installed. In an advantageous layout these openings have a dedicated shape with respect to area and length to reduce/suppress the diffusion and/or transfer of contaminants from the outside to the interior of the vacuum housing as much as possible.

At the same time the contamination reduction unit to a very large extent prevents any contaminating particles/molecules that are present in the vacuum housing or that enter said vacuum housing from reaching the optical surface. The present invention thus results in a reduction of contamination near the surface of the optical elements in that a mini-environment with a reduced number of contaminating particles/molecules, i.e. an ultra high vacuum, is generated around the optical surface so that fewer particles/molecules can deposit on the optical surface.

To this effect it is adequate to reduce the partial pressures of the contaminating particles/molecules in close proximity to the surface and in this way, as far as these substances are concerned, to achieve a better vacuum with respect to contaminant partial pressure than is present in the remaining interior space of the housing and/or in the remaining interior space of the vacuum housing. In the context of this application the term "close proximity" of the optical surface relates to a distance of less than 1 cm, preferably less than 0.5 cm from the surface, and in particular it also relates to the surface itself. The lower the partial pressures of the contamination in close proximity to the surface, the less likely is the probability of the contamination growing, and of associated damage to the optical surface occurring.

In a particularly preferred embodiment the contamination reduction unit comprises a purge unit for purging at least a partial region of the vacuum housing with an inert gas, preferably He, Ne, Ar, Kr, Xe or $H_2$, $N_2$ or mixtures thereof. In this arrangement purging using inert gas is preferably carried out outside the region of the free molecular movement by carrying the contamination along in a partial pressure region of the purge gas from $10^{-3}$ mbar to 10 mbar, preferably between $10^{-2}$ and $10^{-1}$ mbar. In this arrangement it is possible in a partial region of the vacuum housing to generate a flow with the purge unit, which flow keeps the contaminating particles/molecules away from the optical surface. Parallel physical processes may be used to suppress the contaminant molecules from the outside to enter the mini-environment, such as counter flow, diffusion reduction etc. During operation of the purge unit in the pressure region stated above the contaminating substances e.g. are carried along by the flow, wherein in this arrangement the diffusion to the optical components does not significantly increase or even is reduced in the purged region despite an increase in the overall pressure.

In addition, the selection of a purge gas also depends on its chemical reactivity, e.g. by reducing the sticking of contaminant molecules on top of the optical surface. However, it should be noted that the selection of both the type and composition of the purge gas, respectively, and of the partial pressure has to be suitably adapted also in relation to the transmission behavior of the EUV radiation, i.e. the EUV light absorption through the let-in gas molecules, and in relation to its chemical reactivity with the optical mirror surface, in particular during EUV light exposure. The purge flow to be set is thus a function of the absorption capacity of the applied gas in relation to the EUV radiation, to its chemical reactivity and to its interaction coefficient with any possible contamination. It is possible to remove the contaminants of the purge gas flow from the vacuum housing by using a dedicated suction unit, which may be connected to a vacuum pump or may simply be implemented as an opening in the vacuum housing for removing the contaminants for generating a flow of purge gas from the inside of the vacuum housing to the outside.

A multitude of variants is possible in designing the purge gas flow. The purge gas can be metered in through an inlet parallel to the optical surface, e.g. by way of the vacuum unit, and ideally it can be pumped out at a side opposite the purge gas inlet, also parallel in relation to the optical surface. As a result of the purge unit it may also be possible to reduce the number of suction units of the contamination reduction unit(s) in that it is possible, in close proximity to an optical element, to do without a pump unit or some other option of contamination reduction, and instead a gas flow is generated to a suction unit that is further away, which suction unit removes the contaminating substances by way of suction from the inside of the vacuum housing. As described above, a suction unit can be implemented as an opening in the vacuum housing in case that the overall pressure inside the vacuum housing (due to the purge gas) is larger than the pressure outside of the vacuum housing, such that a purge gas flow from the inside to the outside of the vacuum housing can be generated. In particular, it is also possible to generate a gas flow into the interior space of the housing, such that the vacuum generating unit removes the contaminating substances by way of suction from the housing.

In a preferred improvement, an outlet is provided in the vacuum housing serving as a suction unit for generating a flow of purge gas from the inside of the vacuum housing to the interior space, the layout of the outlet preferably being chosen to prevent diffusion of contaminating substances from the interior space to the inside of the vacuum housing. The layout (e.g. diameter, length etc.) of the outlet, especially of outlets in the mini-environment that cannot be avoided as e.g. light entrance and exit of the vacuum housing, should be chosen in order to achieve optimum contamination suppression. The layout, in particular the area and length of the outlet should be chosen so as to reduce the diffusion and/or transfer of contaminants from the outside to the inside of the vacuum housing as much as possible. This can be done e.g. by implementing the outlet in a tubular shape with an appropriate length and diameter, serving as a valve for reduction of the diffusion of contaminating substances from the outside to the inside of the vacuum housing. The person skilled in the art will appreciate that, in accordance with the laws of fluid dynamics, other ways of constructing the outlet are possible which allow to reduce the diffusion of contaminating substances from the outside of the vacuum housing to its inside.

In a highly preferred embodiment, the optical arrangement further comprises a cleaning head for directing a jet of cleaning gas to the optical surface for removing contaminating substances from the optical surface. By bringing the optical surface into contact with a cleaning gas, contaminating substances adhering to the optical surface can be removed in a chemical reaction which transforms the non-volatile contaminants into gaseous species. In this way, carbon contamination can be removed from the optical surfaces by using atomic hydrogen as a cleaning gas, forming e.g. methane ($CH_4$) as a gaseous species which can be transported away from the optical surface. It is understood that the gaseous species produced by the chemical reaction usually do not increase the partial pressure of the contaminating substances close to the optical surface, as these gases do not have a tendency to adhere to the optical surface.

As cleaning gases such as atomic hydrogen are highly reactive not only to carbon but also to other materials such as Sn, Zn, Mn, Na, P, S which may be present in the environment of the optical surfaces, volatile Sn-, Zn-, Mn-, Na-, P-, S-compounds can be formed by a chemical reaction of these materials with atomic hydrogen. These volatile compounds have in general a high probability to adhere to the optical surface, in particular when ruthenium or other metallic caps is/are used as a cap layer of a multilayer system of the reflective optical element. Therefore, the cleaning head should be arranged as close as possible to the optical surface and the distribution of the cleaning gas should be limited mainly to the reflective surface (preferably being uniform at the surface), so that the reaction of the cleaning gas with the environment can be reduced. Therefore, providing an encapsulation of the cleaning jet inside the vacuum housing is advantageous.

In a preferred improvement, the cleaning head comprises an activation unit for generating the jet of cleaning gas by at least partially activating a flow of a purge gas, preferably of molecular hydrogen. In this case, the cleaning head can also be used as an inlet for a purge gas, i.e. the gas jet which is provided by the cleaning head comprises a mixture of the cleaning gas with non-activated (inert) purge gas. By using a gas jet providing both the cleaning gas and the purge gas, a dedicated flow towards a suction unit to transport away possible contaminants can be generated. In the case of atomic hydrogen cleaning, also the purge gas may be molecular hydrogen which may be cracked to form atomic hydrogen with a relatively low cracking efficiency when fluxes of up to 2000 (standard cubic centimeters per minute) or more are used. The activation unit preferably comprises a heated filament for cracking molecular hydrogen (at temperatures of typically up to 2400° C.).

In a further preferred embodiment, the vacuum housing at least in one partial region on its inside comprises a material with a low atomic hydrogen recombination rate, preferably glass, in particular quartz glass. In such a way, recombination of atomic hydrogen to molecular hydrogen at the walls of the vacuum housing can be reduced. Moreover glass, in particular quartz glass, can be used to encapsulate components on the inside of the vacuum housing which are susceptible of outgassing contaminating substances.

In a highly preferred embodiment, inside of the vacuum housing only materials are provided which do not generate outgassing products induced by the cleaning gas, as e.g. metal hydrides in the case of atomic hydrogen usage. In most cases, materials inside of the vacuum housing are present as oxides on the optical surfaces. In almost all cases, atomic hydrogen is capable of reducing these oxides. The bare material may now evaporate, or it may form a hydride with the atomic hydrogen. The likelihood of either path is determined by the vapor pressure of the hydride and of the bare, typically metallic material. As the hydrogen-induced outgassing products typically generate irreversible contaminations on the optical surfaces, the presence of materials such as Sn, Zn, Mn, Na, P, S etc. having a low vapor pressure should be avoided totally inside of the vacuum housing.

In particular, essentially all of the components outgassing contaminating substances which are required for the operation of the optical arrangement, such as cabling, soldering material etc., are arranged outside of the vacuum housing. If such components are still required inside of the vacuum housing, these are encapsulated with a material having an outgassing rate which is preferably very low. This is advantageous as although in principle it may be possible to encapsulate most of the components inside of the housing this is only possible with considerable additional expenditure, compared to encapsulation of only a few such components inside of the vacuum housing. Particularly preferred, except for the optical surfaces and the inner surfaces of the vacuum housing, no other components are present inside of the vacuum housing.

In a further highly preferred embodiment, a measuring unit for measuring a contamination status of the optical surface is arranged inside of the vacuum housing. The measuring unit may be designed e.g. as described in German patent application DE 10 2007 037942.2 filed by the applicant on Aug. 11, 2007, the entire contents of which are hereby incorporated by reference. In particular, the components of the measuring unit (light source(s) and sensor element(s)) which may be outgassing contaminating substances may be encapsulated by an appropriate, in particular transparent material such as quartz glass. In this way, the partial pressure of contaminating substances can be kept at a low level and the contamination status, in particular the thickness of the contamination layer, can be measured. As described in detail in the application cited above, it is highly preferred to use a LED (or UV source) as a light source for the measuring unit. It is understood that measuring of the contamination status of the optical surface by using other measuring techniques (including non-optical techniques) may be used as well.

In a further preferred embodiment, the vacuum housing and the optical element are temperature-resistant up to a baking temperature of 100° C. or more, preferably of 150° C. or more. In this case, the walls of the vacuum housing (e.g. consisting of stainless steel) can be baked out to reduce any kind of contamination (in particular water) on these walls, as the optical element which is heated up along with the vacuum housing can sustain the heating up to the baking temperature without deterioration of its optical characteristics. In particular, in the past, the maximum temperature which the multilayer system of the reflective optical element could sustain was approx. 60° C., as above this temperature, inter-layer diffusion leads to a deterioration of the optical characteristics of the multilayer system, thus limiting the maximum baking temperature to that value. The recent development of multilayer systems with interlayers serving as diffusion barriers, showing temperature resistance up to 200° C. or more, allows for baking of the vacuum housing before the exposure process takes place. Moreover, the possibility of baking out the environment of the optical surfaces was limited by temperature-sensitive materials which were located near the optical surfaces and which can now be arranged outside of the vacuum housing, thus also allowing for limited restrictions on the material choice of these modules. Preferably, the optical arrangement further comprises at least one heating unit for heating at least one vacuum housing to the baking temperature. It is understood that no materials which cannot sustain the baking temperature may be arranged inside of the vacuum housing, i.e. all temperature-sensitive equipment is arranged outside of the vacuum housing.

In a preferred embodiment the contamination reduction unit is designed to generate a partial pressure of water of less than $10^{-7}$ mbar and/or a partial pressure of hydrocarbons, preferably of non-volatile hydrocarbons, of less than $10^{-9}$ mbar, preferably of less than $10^{-13}$ mbar at the optical surface. As a result of the arrangement according to the invention the partial pressure of water on the optical surface can be reduced to below $10^{-7}$ mbar, e.g. to $0.8 \times 10^{-7}$ mbar, $0.5 \times 10^{-7}$ mbar, $1 \times 10^{-8}$ mbar and below, whereas in prior art the partial pressure of water on the optical surfaces is $10^{-7}$ mbar or above. Likewise, the partial pressure of (non-volatile) hydrocarbons can be further reduced from the previous minimum of $10^{-9}$ mbar e.g. to $0.8 \times 10^{-9}$ mbar, $0.5 \times 10^{-9}$ mbar, $1 \times 10^{-10}$ mbar and below, ideally to less than $10^{-13}$ mbar.

In a particularly preferred embodiment the contamination reduction unit is designed to generate a partial pressure of the contaminating substances of less than $10^{-9}$ mbar, preferably of less than $10^{11}$ mbar, particularly preferably of less than $10^{-13}$ mbar. As a result of the invention, in close proximity to the mirrors it is not only possible to reduce the partial pressures of hydrocarbons or of water to an overall partial pressure of below $10^{-13}$ mbar, but of all contaminating substances, which in particular also include volatile and non-volatile hydrocarbons, gaseous metal compounds and organic compounds containing sulphur, phosphorus or silicon, in particular silicon compounds, siloxanes, phthalates, hydrocarbons with carbonyl functions (e.g. methylmetacrylate, acetone etc.), sulphur dioxide, ammonia, organophosphates, aliphatic hydrocarbons, aromatic hydrocarbons, perfluorinated hydrocarbons, metal hydrides etc. to an overall partial pressure of below $10^{-13}$ mbar. By reducing the partial pressures of the contaminating materials in close proximity to the optical surfaces the deposit of contamination on the optical surfaces is greatly reduced, wherein in more remote regions of the vacuum housing or in the remaining interior space the (overall) partial pressure of the contaminating substances, which partial pressure has been generated by the vacuum generating unit, is higher, in particular greater than approximately $10^{-7}$ mbar. It is understood that usually, the lower the partial pressure of contaminating substances outside of the vacuum housing is, the lower is the partial pressure of contaminating substances in the mini-environment close to the optical surfaces. Usually, the partial pressure of contaminating substances, in particular of non-volatile hydrocarbons, at least in close proximity to the optical surface, is reduced by a factor of 10 or more, preferably 100 or more, more preferably 1000 or more, in particular 10000 or more, as compared to the partial pressure of the contaminating substances in the interior space. Typically, the partial pressure of non-volatile hydrocarbons in the interior space is larger than $10^{-9}$ mbar.

In a particularly preferred embodiment the contamination reduction unit comprises at least one suction unit for removing by suction contaminating substances from the vacuum housing, which suction unit is preferably provided in close proximity to the optical surface and is preferably affixed to the vacuum housing. In this arrangement the suction unit typically comprises a vacuum pump which along a preferred direction of pumping removes by suction any contaminating particles/molecules that remain in the vacuum housing, as a result of which process a reduced contamination load is generated on the optical surfaces. Consequently, lower partial pressures (e.g. of hydrocarbons) in close proximity to the optical surfaces of the mirror elements can be achieved. Alternatively, in particular when using a purge gas, the suction unit may be implemented as a dedicated opening in the vacuum housing which is used as a gas outlet for the purge gas, the interior space of the vacuum housing having a larger pressure as compared to the pressure outside of the vacuum housing, thus allowing the purge gas to flow from the vacuum housing to the interior space of the housing.

In a preferred improvement of this embodiment the suction unit is designed such that in the vacuum vessel a pressure gradient essentially parallel to the optical surface is generated. In this arrangement the pressure gradient typically extends, starting from the optical surface, right up to the suction unit, i.e. the pressure gradient is directed essentially radially outwards. In this arrangement the pressure gradient is typically generated at a distance of approximately 1 to 2 cm from the optical surface.

In a preferred embodiment the vacuum housing is connected either to a further vacuum housing or to the remaining interior space of the housing. By providing an essentially gas-proof connection of several vacuum housings together a multitude of optical elements can be shielded from the remaining interior space of the housing, wherein two vacuum vessels attached to each other can for example shield the space between two optical elements from the remaining interior space of the housing in a gas-proof manner. The term "essentially gas-proof connection" refers to a connection which under the given conditions (tiltable mirrors etc.) is constructed so as to be as tight as possible. As an alternative it is also possible to shield only selected optical elements from the remaining interior space of the housing. This can be advantageous if contamination on these elements results in particularly disadvantageous consequences to the entire optical arrangement, which in the case of EUV projection exposure apparatuses is, for example, the case with mirrors in close proximity to the EUV light source, because these mirrors are subjected to particularly high light intensities, or in the case of mirrors in close proximity to the photosensitive layer (resist) because the latter frequently outgasses contaminating particles.

In a preferred embodiment the optical surface of the optical element is arranged in a beam path extending within the housing, with the beam path extending through an opening in the vacuum housing. As a result of this the beam path is at least partly shielded from the remaining interior space of the housing. In particular by utilizing one or a multitude of vacuum housings it is possible to achieve complete separation of the beam path of the optical arrangement from the remaining components of the optical system (see below). In this arrangement openings which connect the vacuum vessels to the remaining interior space of the housing are preferably arranged in the beam path in such a manner that the opening can be made as small as possible, i.e. preferably in close proximity to focal points.

In a further preferred embodiment the vacuum housing encloses the beam path in a jacket-like manner, as a result of which arrangement shielding of the beam path can be achieved over a substantial distance right up to a further optical element. Enclosure of the beam path in a jacket-like manner is for example achieved by a cylindrical shape of the vacuum housing.

In a particularly preferred embodiment the entire beam path extending in the housing is essentially completely separated from the remaining interior space of the housing by one or a plurality of vacuum housings that are connected to each other in a gas-proof manner. As a result of this in an ideal case complete gas-proof separation of the optical surfaces from the remaining components of the optical arrangement is achieved. Since in EUV systems certain mirrors are affixed so as to be slidable or tiltable, such separation may not be entirely achievable because, as a rule, the vacuum housing cannot be moved together with the mirrors. The term "essentially complete" denotes that separation is to be provided as fully as possible, taking into account practical limitations.

However, by connecting the tiltable mirrors on the vacuum housings through a flexible vacuum component (e.g. a corrugated bellows) complete separation can be achieved. In such complete separation of the beam path with the optical surfaces from the remaining interior space of the housing the pressure can then be selected to be higher than is the case in known systems; in an ideal case the pressure in the remaining interior space can even be equal to atmospheric pressure. In this case a vacuum is only generated in the separated region containing the beam path.

In a further preferred embodiment the vacuum housing encloses at least the optical surfaces of two optical elements, which are preferably arranged successively in the beam path. This is advantageous in particular when the optical elements are arranged at a short distance or essentially parallel in relation to each other so that for design reasons this variant is preferable when compared to providing a vacuum vessel for each individual optical element.

In a further preferred embodiment of the optical arrangement the contamination reduction unit comprises a cooling unit which cools the vacuum housing to temperatures of less than 290 K, preferably of less than 80 K, particularly preferably of less than 20 K. In order to cool the vacuum housing to these temperatures, coolant in the form of water, liquid nitrogen or liquid helium can be used. In this way a so-called cryo-panel is produced on the inside of the vacuum housing, which cryo-panel binds the contaminating particles to the surface of the vacuum housing. In this case the vacuum housing acts as a contamination reduction unit which on the inside preferably comprises at least one partial region with a surface that has been enlarged, e.g. by surface roughening.

As an alternative or in addition the vacuum housing can be used as a contamination reduction unit, and at least in one partial region on its inside can comprise a gas-binding material, in particular titanium, tantalum, niobium, zircon, thorium, barium, magnesium, aluminium, ytterbium or cerium. Apart from binding contaminating particles by way of out-condensing (see above) said particles can also be adsorbed on the inside of the vacuum housing, wherein in this case too a raised surface on the inside of the vacuum housing is advantageous. The partial region on the inside can be formed by the vacuum housing itself or by applying additional elements that comprise a suitable surface finish, or by coating the inside using the materials mentioned.

Provided at least one component is arranged in the interior space, which component outgases contaminating particles/molecules, in a further preferred embodiment the contamination reduction unit comprises a suction unit which, by way of suction, removes from the interior space of the housing the substances outgased by the component. In this arrangement the component can be arranged within a vacuum housing that forms a partial volume, or it can be arranged in the remaining interior space of the housing. Further suction units are preferably arranged on those components that outgas contaminating gases, in particular water or hydrocarbons, in particularly large quantities. As a result of removal by suction it is possible to incur less expenditure in the selection of materials and devices suitable for EUV for use in housings for EUV systems. The components can, for example, be sensors or further design-related devices, e.g. mounts, mirror modules, electronic components, actuators, cable harnesses, adhesive points, lubrication points or similar. Typically the suction unit or the suction opening of the suction unit is arranged directly in front of the outgasing component and encloses said component at least in part. As an alternative to removal by suction the outgasing component can also be separated in a gas-proof manner, e.g. by encapsulation, from the remaining interior space of the housing or the vacuum housing.

In a particularly preferred improvement the component is arranged on the substrate or on a holding device of the optical element. In this case removal by suction or encapsulation is particularly advantageous because the component is arranged in close proximity to the optical surface and can therefore particularly easily contaminate said optical surface. In this arrangement the outgassing component can be arranged on the substrate of the optical element and as a rule is then also enclosed by the vacuum housing of the optical element; as an alternative the outgasing component can also be positioned on the holding device of the optical element and thus typically in the remaining interior space of the optical arrangement.

The invention is also implemented in an optical arrangement, in particular in a projection exposure apparatus for EUV lithography, comprising: a housing that encloses an internal space; at least one, in particular reflective, optical element with an optical surface, which optical element is arranged in the housing; at least one vacuum generation unit for generating a vacuum in the interior space of the housing; and at least one component arranged in the interior space, which component outgases contaminating substances. A suction unit is associated with the component, which suction unit removes, by suction, from the interior space of the housing the particles outgased from the component. The suction unit differs from the vacuum generating unit in that it allows targeted removal by suction, i.e. the suction unit or its suction opening is arranged in the interior space, namely usually adjacent to the outgasing components.

By removing by suction the outgased particles/molecules from the interior space, it is also possible to reduce the partial pressure of the contaminating substances on the surfaces of optical elements. In this arrangement removal by suction can take place either only on those components which generate the largest discharge of contaminating substances or which are arranged particularly unfavorably, i.e. in particular adjacent to the optical surfaces; or as an alternative, removal by suction can take place on all non-optical components or materials and devices in the housing. In this way in an ideal case the same result can be achieved as in the case where one optical element or several optical elements are shielded from the remaining interior space of the housing by vacuum housings with an associated contamination reduction unit. Through removal by suction, in the interior space of the housing, in which space the optical surfaces are arranged, and by utilizing the vacuum generating unit, a partial pressure of contaminating particles, in particular of water and/or hydrocarbons on the optical surface of less than $10^{-9}$ mbar, preferably of less than $10^{-11}$ mbar, particularly preferably of less than $10^{-13}$ mbar can be generated.

In a preferred embodiment the outgasing component is arranged on a substrate or on a holding device of the reflective optical element. As stated above, removal by suction on such components is particularly advantageous because as a result of their position in close proximity to the optical surface said components are associated with a particularly high probability of contamination.

In a further preferred embodiment the optical arrangement comprises a purge unit for purging at least a partial region of the interior space of the housing with an inert gas, preferably He, Ne, Ar, Kr, Xe or $H_2$, $N_2$ and mixtures thereof, wherein the purge unit is designed for generating a purge-gas partial pressure of between $10^{-3}$ mbar and 10 mbar, preferably of between $10^{-2}$ mbar and $10^{-1}$ mbar. The purge unit can be used for supplying the outgased substances to the suction unit or to the vacuum generating unit in that a directional inert gas flow is generated. In this arrangement the suction unit can be connected to a vacuum pump of the vacuum generating unit; it differs from the latter essentially by the provision of a suction opening, e.g. in the shape of a funnel, in the interior of the housing, which suction opening makes possible directional removal by suction.

In a preferred embodiment of the optical arrangements described above a residual gas analyzer for determining the partial pressure of the contaminating substances is provided. The residual gas analyzer is used for determining the partial pressure of the contaminating substances in the interior space. In the context of this application the term "residual gas analyzer" refers to a mass spectrometer (e.g. a Quadrupol spectrometer) which is used for measuring the partial pressure distribution of mass or of a mass spectrum of the gas particles in an experimental volume under vacuum conditions, in the present case in the interior space of the housing. Such mass spectrometers basically comprise an ion source which ionizes parts of the gas mixture to be investigated, an analyzer system for separating the various gas ions according to their mass-charge ratio, as well as an ion detection system for measuring the ions or ion flows relating to the mass-charge ratios to be detected. By the residual gas analyzer, it is possible to check whether the partial pressures of contaminating substances, in particular of water and hydrocarbons, are within the specified range, i.e. in the case of $p(H_2O)=10^{-7}$ mbar and $p(C_xH_y)=10^{-9}$ mbar or lower for a typical EUV projection exposure apparatus.

In a preferred improvement of this embodiment a calibration leakage for introducing an inert gas at a defined leakage rate into the interior space of the housing is provided on the housing. In conventional residual gas analyzers it has been noted that during operation of the optical arrangement the sensitivity is gradually reduced or that said analyzers are operated with incorrect filament parameters so that it is not clear whether the partial pressure of the contaminating substances is already in the specified range or still above it. By utilizing the calibration leakage, the residual gas analyzer can be calibrated relatively, and in this way its function can be monitored because, depending on the selected leakage rate and bottle size of the gas supplied, the output rate of the calibration leakage can be stable over several years. The leakage rate of the calibration leakage is selected to be sufficiently small so that it does not have any detrimental effect on the vacuum. The inert gas used can for example be krypton or xenon, which comprises a mass-charge ratio of more than 45, or a mixture of different inert gases. In particular singly-ionized xenon ($Xe^+$) has a mass-charge ratio which is around approximately 100 units of mass and is thus in the region of the critical hydrocarbons.

With the above-described residual gas analyzer with calibration leakage it is possible for a method to be carried out during the switching-on procedure, i.e. while a vacuum is generated in the interior space of the housing and still prior to an EUV light source being switched on for illumination operation, in which method analysis of the gas in the interior space takes place either continually or at certain time intervals, e.g. every 10 minutes. In this arrangement the contamination partial pressures are allocated relative to the inert gas partial pressures of the calibration leakage, and the illumination source is activated only when the former are in the desired specification, i.e. below a critical threshold value. In contrast to this, from prior art it is only known to wait for a determined period of time (approximately 10 h) after commencement of pumping out, so as to ensure that the partial pressures of the contaminating substances are below the threshold value. With the method described above the EUV illumination instrument may be able to commence illumination operation much earlier, e.g. already after a few hours.

In a further preferred embodiment an optical resonator for determining the partial pressure of the contaminating substances is provided. In the measuring arrangement, which in this patent specification is used for determining the partial pressure, the optical resonator is also referred to as a ring-down cavity. When compared to the residual gas analyzer this measuring arrangement provides an advantage in that no sputter products occur through the filament.

In an advantageous improvement of this embodiment the optical resonator is arranged on the surface of the optical element and preferably encloses said surface. In contrast to measuring with the residual gas analyzer, with the use of an optical resonator partial pressure measuring can take place "in situ", i.e. in close proximity to the optical surface. The above-described reduced partial pressures of the contaminating substances can thus be measured directly on the optical surfaces, namely to a high-vacuum pressure range of $10^{-13}$ mbar and below.

In a further advantageous embodiment the optical arrangement comprises a laser light source for supplying laser pulses to the optical resonator, and an analyzing device, arranged downstream of the optical resonator, for measuring the intensity of the laser pulses over time. If necessary the laser light source and the analyzing device can be autonomous units, i.e. it is not mandatory for them to be integrated in the optical arrangement. In so-called cavity ringdown absorption spectroscopy, a laser pulse is input into the optical resonator, and, with the analyzing device, the intensity gradient of the photon lifetime of the pulse is measured over time. Analyzing of the decay curves provides information about the absorption and thus about the concentration of the partial pressures, contained in the EUV vacuum, of the contaminating substances to be investigated. The laser used is preferably a variable frequency laser, because depending on the input wavelength selective investigation of various gases can be carried out. In particular at one wavelength a search for water can be undertaken, whereas at another wavelength a search for particular hydrocarbons can take place.

The invention is also implemented in a reflective optical element of the type mentioned in the introduction, with an electrically conductive layer arranged between the substrate and the multilayer system, which layer can be electrically contacted for leading away a photocurrent, for earthing or for applying a defined voltage. By forming photoelectrons, in particular secondary electrons, during radiation with EUV light, charges are generated on the optical surface of the element, which charges cannot be led away by way of the substrate because said substrate is either electrically insulating or is significantly less conductive when compared to the multilayer system.

While the charges can be led away from the optical surface in that the latter is directly contacted electrically, this can, however, impair the surface shape, the surface roughness etc. of the optical surface. By applying an additional electrically conductive layer between the substrate and the multilayer system, contacting at this layer can take place, as a result of which any impairment of the optical surface is prevented. By applying a defined voltage or by earthing the electrically conductive layer, by way of this layer charges can be led away from the optical surface, and in this way electrostatic charging of the surface of the optical element can be prevented. In addition or as an alternative, contacting can also be used for measuring the photocurrent that arises during radiation with EUV light by forming secondary electrons. The photocurrent provides an indication of the degree of contamination or the degradation of the optical surface.

In a preferred embodiment the electrically conductive layer comprises a metal, in particular gold, nickel, ruthenium, rhodium, palladium, molybdenum, iridium, osmium, rhenium, silver, zinc oxide or related alloys or a multilayer system, in particular comprising alternating Mo/Si or Mo/SiNi layers. Electrically conductive layers made of these materials can be applied in a simple manner to the substrate. The use of a multilayer system as an electrically conductive layer is advantageous in that in principle the same coating technology can be used, in particular also at the same time, which technology is also used in the application of the EUV-reflective layers.

In a particularly preferred embodiment the thickness of the electrically conductive layer is less than 50 nm, preferably less than 1 nm. The thinner the electrically conductive layer the less material is required and the lower the risk of an increase in roughness.

In a further preferred embodiment the substrate with the electrically conductive layer protrudes in an edge region of the multilayer system, and in the edge region at least one contact for connecting a line to the electrically conductive layer is provided. Usually the optical surface is smaller than the surface of the mirror substrate, so that in that part at which the mirror substrate protrudes it is possible to provide a suitable contact, e.g. a solder point or an adhesive point or a connection, e.g. a clamp.

The invention is further implemented in a reflective optical element of the type mentioned in the introduction, which comprises a material that is arranged on the substrate adjacent to the optical surface, which material adsorbs contaminating substances. In a specified partial pressure of contaminating substances (gases) there is a determined probability of occupation at the surface of the optical element. As a result of the non-directional random movement of the contaminating atoms and molecules across the surface, depending on the temperature of the surface, the ambient pressure, the flow conditions etc., said atoms and molecules can reach the adsorbent material in finite time.

In a preferred embodiment the adsorbent material encloses, in particular in a ring-shaped manner, the optical surface, i.e. the surface which during exposure operation is impinged on by light. In this arrangement the shape of the adsorbent material matches the shape of the optical surface, i.e. for example it is ring-shaped in the case of a circular optical surface. If a ring from a highly adsorbent material is placed around such a surface, the contaminating substances "stick" to this ring and do not further react, so that the optical surface remains intact.

In a further, particularly advantageous, embodiment the adsorbent material is ruthenium. It has been known to cap multilayer systems for EUV lithography with a cover layer comprising rhodium, palladium, molybdenum, iridium, osmium, rhenium, silver, zinc oxide or their alloys or related alloys, particularly preferably ruthenium, because these materials have strongly catalytic characteristics. This characteristic becomes particularly clear during radiation of the surface in a typical EUV environment, which is dominated by water and hydrocarbon partial pressures, and in which almost always an increase in carbon as a result of the EUV radiation can be observed on the catalytic cover layer, i.e. the optical surface is contaminated by carbon, wherein the contamination increases as the length of time of radiation exposure increases. Experiments have shown that contamination by Sn and Zn atoms has a great affinity to deposit on pure ruthenium, in contrast to ruthenium surfaces that are contaminated with carbon and in which within the measuring errors practically no Sn and Zn atoms can be found. By placing a ring of ruthenium around the optical surface, which during radiation is not exposed to any EUV radiation and is thus not contaminated with carbon, the adherence of Sn and Zn contamination to the absorbent ring is significantly increased compared to the optical surface contaminated with carbon.

In a particularly preferred embodiment the optical element comprises a unit for generating a temperature gradient between the optical surface and the adsorbent material, e.g. a heating device for the surface. As a result of heating, the occupation of the contaminating substances on the surface is reduced; said substances move faster, and due to the temperature difference they move towards the adsorbent material because the temperature of said adsorbent material is lower than that of the optical surface. In this arrangement the temperature of the optical surface can e.g. be increased to approximately 60° C. With a suitable selection of diffusion barriers in the multilayer system it is also possible to implement temperatures up to 300° C. in the region of the optical surface.

The invention is also implemented in an optical arrangement, in particular of the type described above, comprising at least one optical element as described above. In this arrangement the same optical element can comprise not only an electrically conductive layer arranged between the substrate and the multilayer system, but also an absorbent material arranged adjacent to the optical surface.

In an embodiment of the optical arrangement the electrically conductive layer is connected, preferably by way of a line, to the mass potential and/or to a current- or voltage measuring device, wherein the current- or voltage measuring device is used for measuring the photocurrent.

In a preferred improvement the line is adapted for measuring the photocurrent at a frequency of more than 1 kHz. Adapting takes place by suitable shielding of the cable as well as by tuning its frequency response. Normally the cable is used for leading the photocurrent signal from the housing of the vacuum system and for feeding it to a measuring system that is arranged outside it. Due to the pulse operation of the EUV projection illumination instrument at frequencies above 1 kHz (up to 10 kHz) pulse-resolved measuring of the photocurrent is necessary, which requires a correspondingly adapted line. Further features and advantages of the invention are provided in the following description of exemplary embodiments of the invention, from the figures in the drawing, which show details that are significant in the context of the invention, and from the claims. The individual characteristics can be implemented individually by themselves, or several of them can be implemented in any desired combination in a variant of the invention.

BRIEF DESCRIPTION OF THE DRAWINGS

The exemplary embodiments are shown in the diagrammatic drawing and are explained in the description below. The following are shown:

FIGS. 5a, b a top view (a) and a lateral view (b) of an optical element whose optical surface is enclosed by an adsorbent material;

FIG. 6 a measuring arrangement for measuring pressure in a high vacuum with absorption spectroscopy with an optical resonator;

FIGS. 7a, b intensity curves, measured with the measuring arrangement according to FIG. 6, of the decay behavior of laser pulses over time;

DETAILED DESCRIPTION OF PREFERRED EMBODIMENTS

Figure 1:
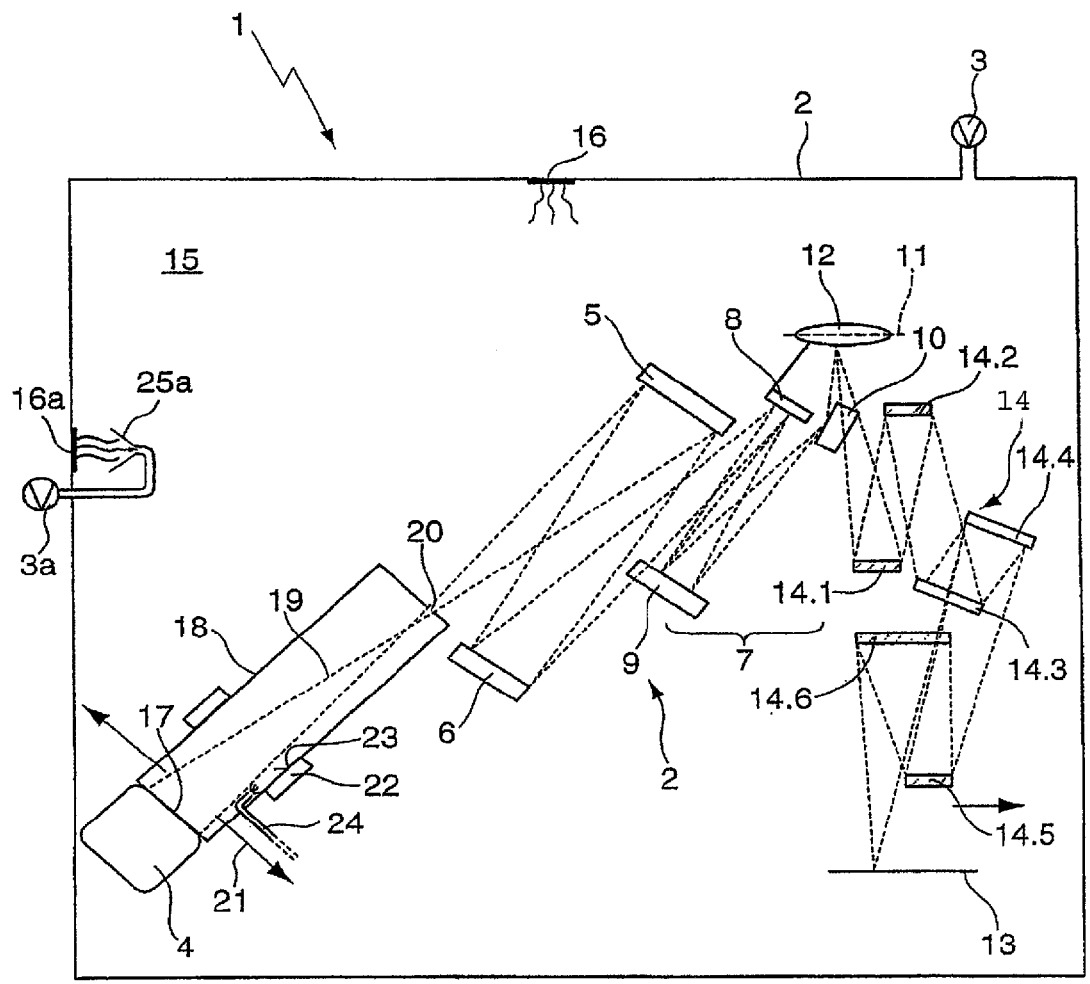
FIG. 1 a diagrammatic view of a first embodiment of an EUV projection exposure apparatus according to the invention, including a vacuum housing that in a partial region encloses the beam path in a cylindrical manner.

FIG. 1 shows a diagrammatic view of a projection exposure apparatus 1 for EUV lithography, including a housing 2 which is associated with a vacuum generating unit 3. The housing 2 is divided into three housing parts (not shown in FIG. 1) according to the optical functions of the components arranged in said housing 2, namely firstly a first housing part with a light generating unit 4 which for example includes a plasma light source and an EUV collector mirror for focusing the illumination radiation.

In a subsequent second housing part the illumination system is arranged which, following the path of the beam, has a mirror with field raster elements 5 and a mirror with pupil raster elements 6. A group of three mirrors, arranged downstream and acting as a telescopic lens 7 includes a first and a second mirror 8, 9 which are operated under normal incidence, as well as a third mirror 10 with negative refractive power, onto which mirror the light impinges at glancing incidence. The illumination system generates as homogeneous an image field as possible in an object plane 11 in which a reticle 12 with a structure (not shown) that is to be imaged at reduced size is arranged.

The structure arranged on the reticle 12 in the object plane 11 is imaged on an image plane 13, by a projection system, arranged downstream, which is arranged in a third housing part, in which image plane 13 a wafer with a photosensitive layer (not shown) is arranged. For reduced-size imaging the projection system 14 has six further mirrors 14.1 to 14.6 as reflective optical elements.

In the housing 2 the vacuum generating unit 3 generates a vacuum at a partial water pressure of approximately $10^{-7}$ mbar and a partial pressure of hydrocarbon of approximately $10^{-9}$ mbar. However, this vacuum is insufficient to effectively prevent the deposit of water and hydrocarbons and further contaminating substances on the surface of the mirrors 4 to 10 or 14.1 to 14.6 and of the reticle 12. The contaminating substances are generated by several components which outgas said contaminating substances into an interior space 15 of the housing 2. Such a component 16 arranged on a partial region of the wall of the housing 2 is shown by way of an example in FIG. 1. Arranging such outgassing components in the housing 2 cannot be completely prevented, because many materials used in EUV projection exposure apparatuses are not bakeable.

The vacuum attainable in the housing 2 is thus downward limited by outgasing of contaminating substances, among other things from the component 16. While it may be possible to improve the vacuum in the housing if extremely high-performance pumps were to be provided, however, in order to avoid incurring additional expenditure and in order to reduce the technical effort it is significantly more advantageous to generate a high vacuum only in close proximity to the optical surface 17 of the collector mirror of the light generating unit 4, which for the sake of simplicity is shown as a planar surface.

This is achieved in that first the optical surface 17 is shielded or separated from the interior volume 15 by a vacuum housing 18. In this arrangement the vacuum vessel 18 encloses, in a jacket-like manner, a beam path 19 which emanates from the optical surface 17, with said vacuum vessel 18 being made from a material that is suitable for vacuum conditions, e.g. stainless steel with a low rate of outgasing. The vacuum vessel 18 separates a partial volume from the interior space 15 of the housing 2 which communicates with the remaining interior space 15 only by way of an opening 20 in the vacuum vessel 18. For example a thin-film filter for vacuum separation and/or for filtering the inward radiated EUV light can be arranged in the opening 20. In this arrangement the vacuum vessel 18 is selected to be of adequate length so that the opening 20 is arranged in a region of the beam path 19, in which region the diameter of said beam path 19 is particularly small. Consequently the beam path 19 can lead through the opening 20 without a large number of contaminating particles being able to enter the partial volume formed by the vacuum vessel 18.

On the cylindrical wall of the vacuum vessel 18 a suction unit 21, indicated by two arrows in FIG. 1, is provided as a contamination reduction unit that moves contaminating particles by pumping action from the partial volume delimited by the vacuum housing 18 into the remaining interior space 15 of the housing 2. It is understood that the suction unit 21 can also be used for removing contaminating particles entirely from the interior space 15, and to this effect if necessary is connected to the vacuum generating unit 3. In either case the suction unit 21 is arranged on the vacuum housing 18 in close proximity to the optical surface 17, i.e. at a distance of approximately 1 to 3 cm from the latter, and is used for generating a pressure gradient essentially parallel in relation to the optical surface 17 such that contaminating particles, starting from the centre of the cylindrical vacuum housing 18, are moved in a radial direction to the suction unit 21.

As a result of the above, in close proximity to the optical surface 17, i.e. at a distance of less than approximately 1 cm, preferably of less than 0.5 cm from the optical surface 17, a high vacuum arises with a partial pressure which for example in the case of water is less than approximately $10^{-7}$ mbar, and in the case of hydrocarbons is below approximately $10^{-9}$ mbar. Contamination of the optical surface 17 with these substances can therefore essentially be prevented. If necessary the partial pressure of the contaminating substances can be still further reduced, for example to less than $10^{-13}$ mbar.

In addition to the suction unit 21, FIG. 1 also provides for a cooling unit 22 which cools the vacuum housing 18 at least in the partial region shown in FIG. 1 with cooling water, liquid nitrogen or liquid helium to temperatures of less than 290 K, 80 K or 20 K, as a result of which additional particles condense on an inside 23 of the vacuum housing 18. In order to increase the surface the inside 23 of the vacuum housing 18 can be coated with a suitable material or it can be provided with a rough surface structure.

Furthermore, a purge unit 24 for purging with an inert gas, preferably He, Ne, Ar, Kr, Xe or $H_2$, $N_2$ or mixtures thereof, is provided as a contamination reduction unit, which outside the region of the free molecular movement carries along the contamination in a partial pressure range of between $10^{-3}$ mbar to 10 mbar. Inert gas purging generates a flow away from the optical surface 17 towards the opening 20 through which contaminating particles transported by the inert gas are moved to the interior space 15 of the housing 2 from where they are removed by suction. Furthermore, by suction removal using the suction unit 21 (indicated by two arrows) on the cylindrical wall of the vacuum vessel 18, contaminating substances or gas particles are moved into the region outside the partial volume delimited by the vacuum housing 18, i.e. into the remaining interior space 15 of the housing 2 or ideally into the region outside the housing 2.

Moreover, in order to improve the vacuum in the interior space 15 of the housing 2 a further suction unit 25$a$ is provided for removal by suction, from the interior space 15 of the housing 2, of contaminating particles that are outgassed by a further component 16$a$. In this arrangement the further suction unit 25$a$ is connected to a further vacuum pump 3$a$, but as an alternative it could also be connected to the vacuum pump 3. Of course the suction unit 21 arranged on the vacuum housing 18 is also connected to a vacuum pump (not shown).

The further component 16$a$ outgases a large quantity of contaminating substances and is shielded by the further suction unit 25$a$ such that the contaminating particles cannot enter the interior space 15 of the housing 2. Removal by suction on the further component 16$a$ is sensible because it releases a larger quantity of contaminating substances than is the case with component 16 which consequently does not mandatorily have to be separated from the interior space 15 of the housing 2. As an alternative to removal by suction the further component 16$a$ can also be separated by an encapsulation from the interior space 15 of the housing 2.

Figure 4:
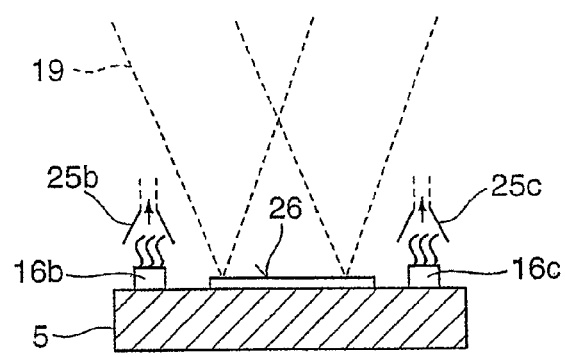
FIG. 4 a section of FIG. 1 with two components that outgas contaminated particles, which components are arranged on an optical element, with associated suction devices.

Of course such contaminating components can also be arranged on the mirrors 4 to 10 and 14.1 to 14.6 as shown in FIG. 4 in relation to the first mirror 5 of the illumination system. Apart from the optical surface 26 arranged in the beam path 19 two further components 16$b$, 16$c$ are arranged on the mirror 5, which further components 16$b$, 16$c$ release further contaminating substances that are collected by associated further suction units 25$b$, 25$c$. Of course in this way removal by suction can also take place on components that are located on the holding devices of the mirrors, or if need be on the mirror holding devices themselves. By suitable encapsulation or removal by suction not only the optical surface 17 itself but also the entire optical element 4 can be integrated in the vacuum housing 18 and can be enclosed by said vacuum housing 18.

Figure 2:
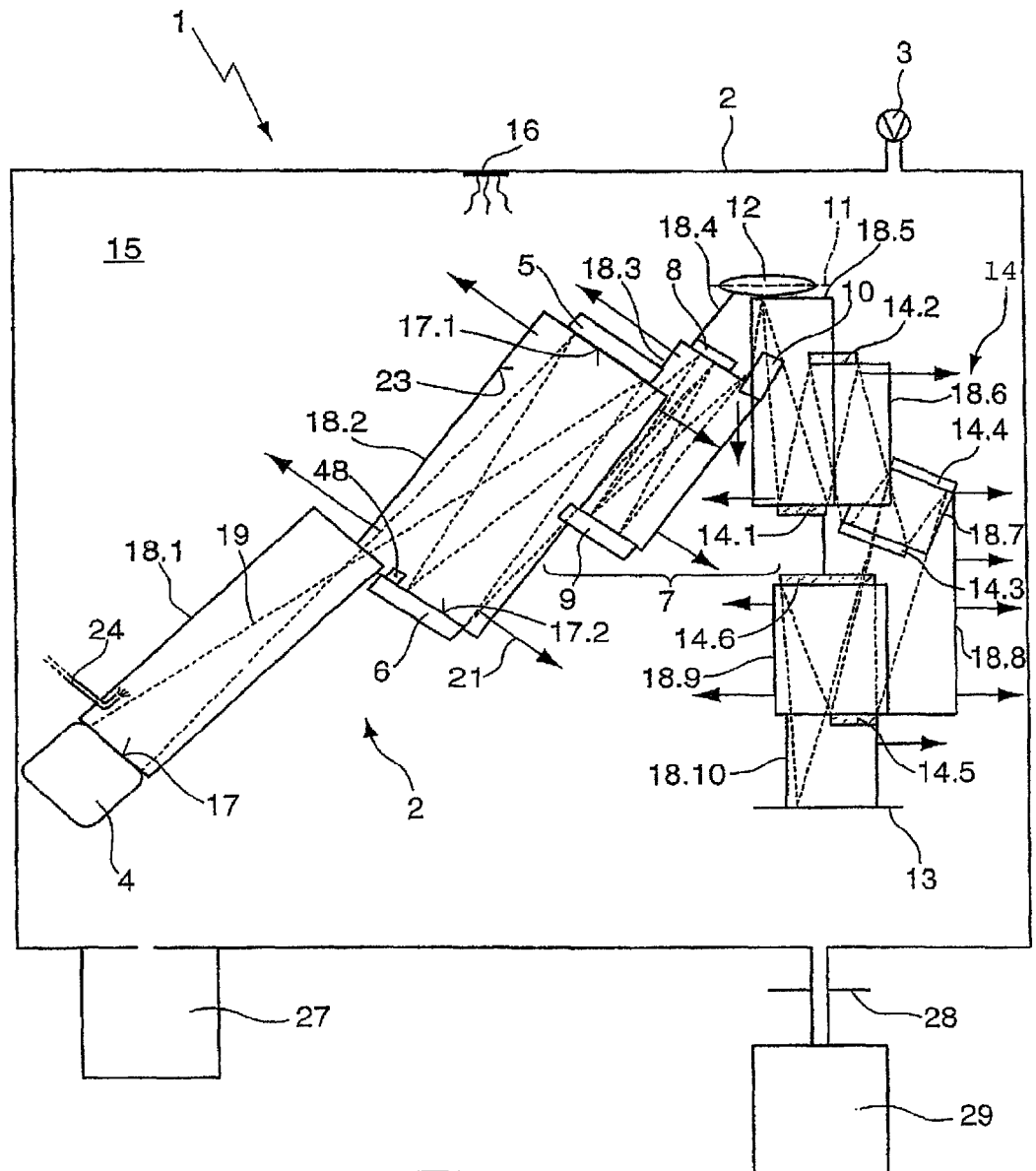
FIG. 2 an analogous diagrammatic view of a second embodiment of an EUV projection exposure apparatus with a plurality of vacuum housings that completely shield the beam path of the apparatus.

While in FIG. 1 a mini environment with particularly good vacuum conditions is generated only on the optical surface 17 of the collector mirror of the light generating unit 4, i.e. on a single optical element, in FIG. 2 such an environment is generated on all mirrors 4 to 10, 14.1 to 14.6 as well as on the reticle 12 of the projection illumination instrument 1, i.e. the entire beam path 19 of the projection illumination instrument is separated from the remaining interior space 15 of the housing 2, and on each optical surface of the mirrors 5 to 10, 14.1 to 14.6 and on the reticle 12, respectively, a high vacuum is generated by suitable suction units 21 that are indicated by arrows as described in more detail in the context of FIG. 1. For this purpose a plurality of vacuum housings 18.1 to 18.10 are provided in the housing 2, in which vacuum housings 18.1 to 18.10, except for the first and last one in the beam path 19, in each case at least two optical elements are arranged. Hereinafter, for the sake of brevity, the term "optical elements" refers to both the mirrors 5 to 10, 14.1 to 14.6 and the reticle 12.

In each case two vacuum housings 18.1 to 18.10 arranged in succession in the beam path 19 are interconnected, e.g. flanged to each other, such that the beam path 19 can pass through a shared opening. Usually in each case two of the mirrors 5, 6 with their optical surfaces 17.1, 17.2 are arranged on opposite walls of the vacuum housing, as is the case e.g. with the second vacuum housing 18.2. In regions in which several optical elements are arranged directly adjacent to each other, e.g. in close proximity to the reticle 12, more than two optical elements can be arranged in a shared vacuum housing.

Optionally all the vacuum housings 18.1 to 18.10 include the cooling devices 22 shown in FIG. 1 and/or in at least one partial region of the inside 23 they can be provided with a gas-binding material, in particular titanium, tantalum, niobium, zircon, thorium, barium, magnesium, aluminum, ruthenium, ytterbium or cerium. In this way an additional reduction in the number of contaminating particles in the vacuum housings 18.1 to 18.10 can be achieved through condensation or adsorption.

In the first vacuum housing 18.1 with the light generating unit 4 a purge unit 24 is arranged which, as described in FIG. 1, generates an inert gas flow that carries contaminating substances along into the adjacent vacuum housing 18.2 from where they are moved by way of a suction unit 21 into the interior space 15. In this case there is no need to provide a suction unit in the internal volume of the first vacuum housing 18.1 because said first vacuum housing 18.1 is connected, so as to be gas-proof, to the light generating unit 4 by way of a flexible vacuum element, thus to an adequate extent keeping substances that contaminate the purge unit 24 away from the optical surface 17.

As a result of the essentially complete encapsulation of the beam path 19 from the remaining interior space 15 of the housing 2, it is possible in those cases to select less favorable vacuum conditions than is normally the case, i.e. the vacuum generating unit 3 can operate at reduced pumping output, more strongly outgasing components can be used, and generally speaking less attention needs to be paid to the outgasing of components. In the most favorable case the vacuum generating unit 3 need no longer be used for generating a vacuum in the interior space of the housing 2 but instead it can merely be used as a pump for the suction units 21. In this case atmospheric pressure prevails in the remaining interior space 15 of the housing 2.

Between the cases shown in FIG. 1 and FIG. 2 respectively, in which cases one optical element or all the optical elements are operated under improved vacuum conditions, any other gradations are of course possible in which for example two, three etc. of the optical elements and their optical surfaces, respectively, are arranged in a high vacuum. In all these cases it is favorable if the partial pressure of the contaminating substances in the interior space 15 or on the optical surfaces 17, 17.1, 17.2 can be measured.

For the purpose of measuring the partial pressures of the contaminating substances in the interior space 15 of the housing 2, a residual gas analyzer 27 is provided that determines a mass spectrum of the partial pressures. In order to calibrate the residual gas analyzer 27 a gas container 29 with xenon as an inert gas communicates with the interior space 15 of the housing 2 by way of a calibration leakage 28. The calibration leakage 28 ensures that there is a constant inflow of inert gas into the interior space 15. The residual gas analyzer 27 can be calibrated and its function can be monitored relative to the leakage rate of the calibration leakage 28. In this way it is possible, in particular during the switching-on process, i.e. when generating the vacuum in the housing 2 with the vacuum generating unit 3, to monitor whether the desired partial pressures of contaminating substances have already been reached and whether the projection exposure apparatus 1 can commence exposure operation.

In addition to the residual gas analyzer 27, which measures the partial pressures of contaminating substances in the interior space 15, an optical resonator 48 is arranged in the housing 2, which optical resonator 48 is used for measuring the partial pressures directly on the optical surface 17.2 of the optical element 6. The entire associated measuring structure is shown in FIG. 6; it includes a laser light source 46 in the form of a pulsed variable frequency laser, input optics 47, the optical resonator 48 (ring-down cavity) and an evaluation unit 49 which includes a detector and an oscilloscope with a computer connected thereto. It is mandatory only to arrange parts of the input optics 47 and corresponding parts for decoupling the laser light in the projection exposure apparatus 1, wherein coupling and decoupling preferably take place by way of fibre optics.

To measure the partial pressure, first the laser light source 46 is set to a wavelength that corresponds to a transition in a gas to be detected, which gas has a contaminating effect on the optical surfaces. Subsequently a laser pulse is generated which enters the optical resonator 48 by way of the input optics 47. The intensity gradient of the laser pulse over time, as shown in FIG. 7, provides information about the extent of absorption of the laser pulses in the volume of the optical resonator 48. FIG. 7a shows a decay curve 50a of the photon intensity without the presence of an absorbent gas in the optical resonator 48, while FIG. 7b shows a decay curve 50b with such an absorbent substance. The diagrams clearly show that in the latter case the life of the photons in the optical resonator is reduced. From the reduction in the half-life value as a result of the absorption, it is possible to obtain information about the concentration of the substance in the optical resonator 48, which substance has been excited in the particular case, and thus to obtain information about its partial pressure. The measuring method described above makes it possible to obtain highly accurate partial pressure measurements right to the regions of less than $10^{-13}$ mbar so that even the extremely low partial pressures of hydrocarbons can be determined directly on the optical surfaces.

Figure 3:
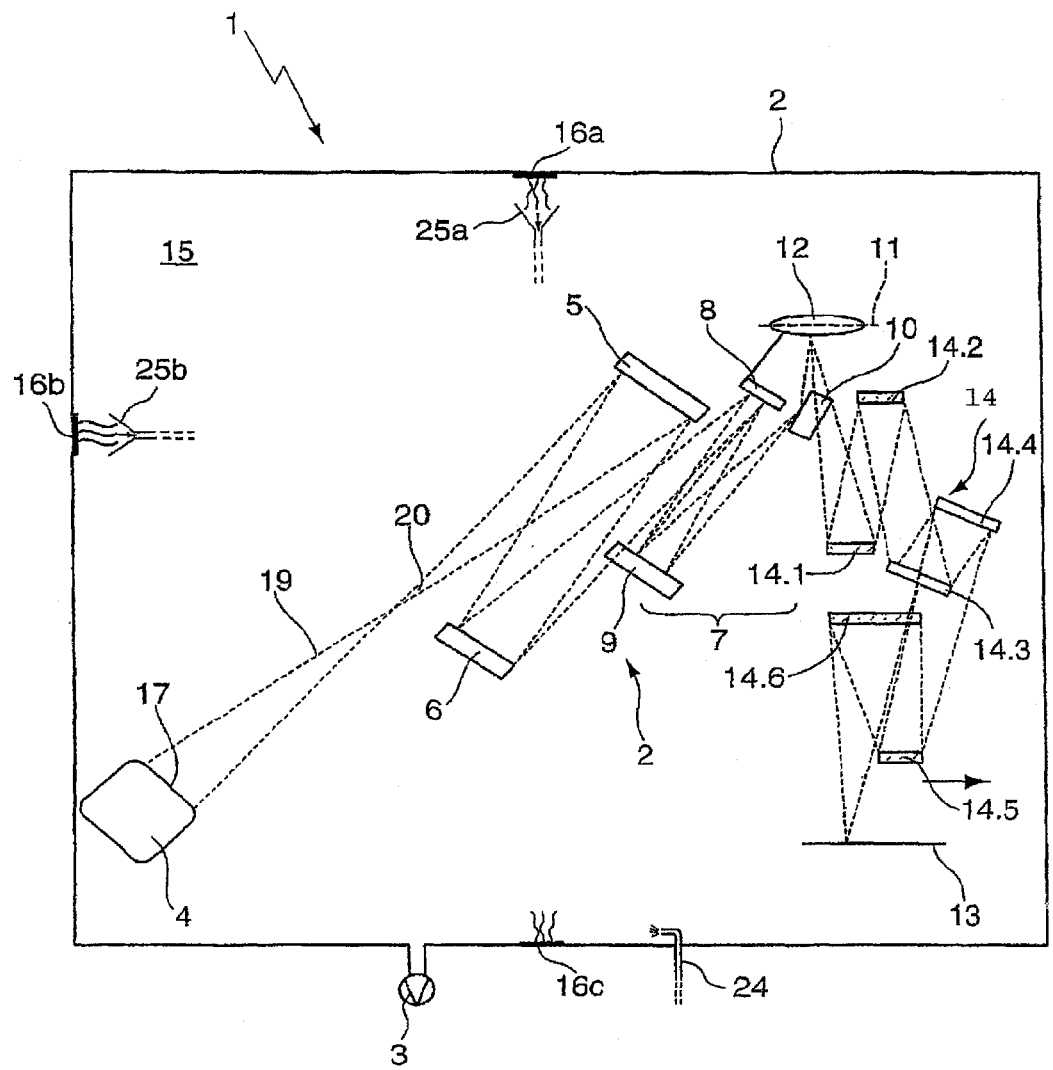
FIG. 3 an analogous diagrammatic view of an EUV projection exposure apparatus in which components that outgas contaminating particles are associated with suction devices.

FIG. 3 shows an alternative option for operating all the optical elements under a high vacuum. By way of an example FIG. 3 shows three components 16a to 16c which outgas contaminating substances. Two of these components are associated with suction units 25a, 25b, which keep the outgased contaminating particles away from the interior space 15 of the housing 2. A purge gas unit 24 is associated with the third component 16c, which purge gas unit 24 generates a purge gas flow. The contaminating particles that have outgased from the third component 16c are carried along by the flow and are moved into close proximity to the vacuum generating unit 3, which removes the particles from the housing 2. If encapsulation of all components 16a to 16c in the housing 2 is provided, or at least of those components that have a particularly strong tendency to outgas contaminating substances, then the vacuum generating unit 3 can generate a vacuum in the interior space 15 of the housing, in which the (overall) partial pressure of contaminating substances is also below $10^{-9}$ mbar. Of course, as a result of this the deposit of contamination on the optical surfaces is also greatly reduced.

Figure 9:
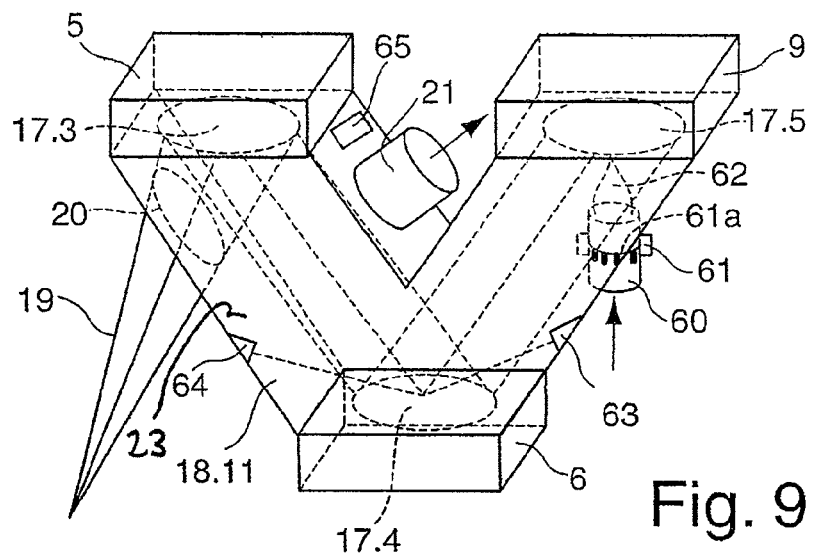
FIG. 9 a diagrammatic view of a vacuum housing with three reflective optical elements and a cleaning head in a three-dimensional representation, and FIG. 10 a diagrammatic view of an essential part of an EUV projection exposure apparatus having an encapsulated beam path.

FIG. 9 shows a further example for reducing the amount of contaminating substances in a mini-environment of a housing 18.11 for the three reflective elements 5, 6, 8 of FIG. 1, the optical surfaces 17.3 to 17.5 of which are arranged essentially in parallel. The vacuum housing 18.11 of FIG. 9 can be fixed to the vacuum housing 18 of FIG. 1, the opening 20 allowing the beam path 19 to reach the optical surface 17.3 of the first reflective optical element 5. In contrast to the arrangements of FIGS. 1 to 4, part of the molecular hydrogen provided by a purge gas unit (not shown) is activated in a cleaning head 60 to form atomic hydrogen by flowing the molecular hydrogen over a filament 61a which is heated to a temperature of approximately 2400° C. by an activation unit 61. The cleaning head 60 is arranged near the optical surface 17.5 of the third reflective optical element 17.5 inside of the vacuum housing 18.11 and is designed to generate a jet 62 of cleaning gas to the optical surface 17.5. The jet 62 of cleaning gas includes atomic hydrogen which is used to remove contaminating substances, in particular carbon, from the optical surface 17.5. The remnant of the jet 62 consists of molecular hydrogen which has not been cracked at the filament 61a and which can be used as a purge gas to generate a flow which removes the reaction products of the atomic hydrogen cleaning, in particular methane, together with further contaminating substances from the vacuum housing 18.11 through an outlet serving as a suction unit 21 which is arranged between the first and second reflective elements 5, 6. The outlet 21 is designed as a tube with a length and diameter which is chosen to prevent diffusion of contaminating substances from the interior space 15 (shown in FIG. 1) to the inside of the vacuum housing 18.11. The person skilled in the art will appreciate that other possibilities of designing the outlet 21 exist for reducing the rate of contaminating particles/molecules diffusing into the vacuum housing 18.11.

It is understood that for each optical surface 17.3 to 17.5, a separate cleaning head may be provided inside the vacuum housing 18.11. When no cleaning is required, the filament 61a may be switched off, thus allowing the cleaning head 60 to be used as an inlet for molecular hydrogen as a purge gas. It is understood that apart from molecular hydrogen, other purge gases, in particular the ones described above, may be activated by the heated filament 61a as well.

Also, in order to increase the cleaning rate of the atomic hydrogen cleaning, on the inside 23 of the vacuum housing 18.11, a quartz glass coating is provided. Glass-like substances, in particular quartz glass, are known to have a low atomic hydrogen recombination rate, so that atomic hydrogen which impinges on the inside 23 of the vacuum housing 18.11 has a low probability of recombining, so that no molecular hydrogen is formed on the inside 23 of the vacuum housing 18.11, thus increasing the reaction rate with the contamination present on the optical surface 17.5.

Additionally, a measuring unit with a LED as a light source 63 and an optical sensor 64 are arranged inside of the vacuum housing 18.11 for determining the contamination status of the optical surface 17.4 of the second optical element 6. The LED 63 emits light at a wavelength in the visible spectrum which is reflected from the optical surface 17.4 to the sensor element 64 measuring the intensity of the reflected light for determining the contamination status, in particular the thickness of a contamination layer (not shown) on the optical surface 17.4 in the way described in detail in the above-referenced German patent application DE 10 2007 037942.2. As the optical sensor 64 and the light source 63 may outgas contaminating substances, they are encapsulated by the quartz glass coating on the inside 23 of the vacuum housing 18.11. As no other outgassing components are arranged inside of the vacuum housing 18.11, the amount of contaminating substances inside of the vacuum housing 18.11 can be kept very low.

The provision of the quartz glass coating on the inside 23 of the vacuum housing 18.11 has the additional advantage that hydrogen induced outgasing, i.e. outgasing of contaminating substances from materials inside the vacuum housing 18.11 due to reaction with atomic hydrogen can be prevented, as quartz glass is essentially inert to atomic hydrogen. Other materials which do not generate volatile cleaning-induced outgasing products, in particular steels which do not contain Sn, Zn, Mn, Na, P, S, are also suitable for this purpose.

In order to remove contaminating substances from the inside 23 of the vacuum housing 18.11 before the exposure starts, i.e. during downtime of the EUV projection exposure apparatus 1, a heating unit 65 is provided for homogeneously heating of the vacuum housing 18.11 to a baking temperature of 150° C. In this way, contaminating substances, in particular water, can be desorbed from the inside 23 of the vacuum housing 18.11 and transported to the outside via the suction unit 21. For the baking to be possible, no materials may be arranged inside of the vacuum housing 18.11 which cannot sustain the baking temperature. In particular, the reflective optical elements 5, 6, 9 are provided with a multilayer system (not shown) on top of which the optical surfaces 17.3 to 17.5 are arranged, the multilayer system being resistant to temperatures of up to 200° C. without degradation of its optical characteristics.

Figure 10:
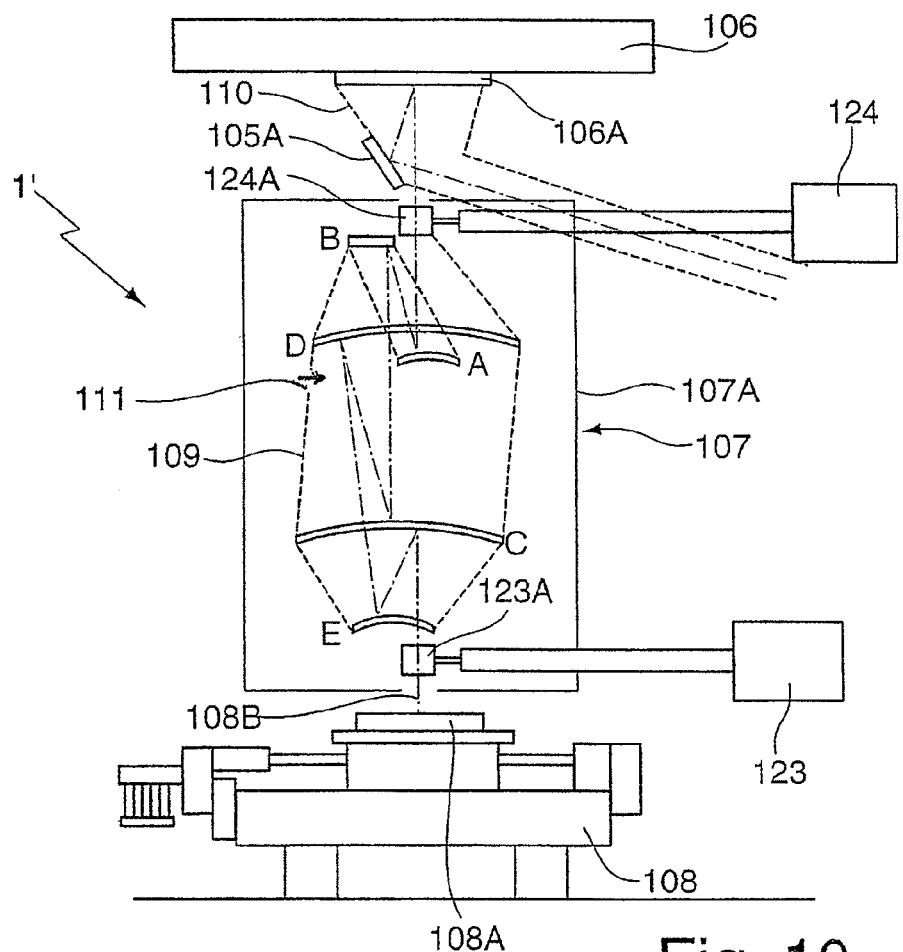

FIG. 10 shows an essential part of a further EUV projection exposure apparatus 1', as described in US patent application 2005/0275821 A1, the entire contents of which are hereby incorporated by reference. The EUV projection exposure apparatus 1' includes a projection optical system 107 for reduced imaging of a structure on a reticle 106A arranged on a reticle stage 106 to a photosensitive resist of a wafer 108A arranged on a wafer stage 108. A housing 107A of the projection optical system 107 has a first cryogenic refrigerator 124 with a cryogenic panel 124A which is arranged close to an opening to the space where the reticle 106A is arranged and a second cryogenic refrigerator 123 with a cryogenic panel 123A close to the space where the wafer 108A is arranged. The beam path 108B of EUV radiation inside the projection system 107 passes through the first cryogenic panel 124A and is reflected by five reflective optical elements A to E before it passes the second cryogenic panel 123A and impinges on the wafer 108A.

The beam path between the first and the second cryogenic panels 124A, 123A is entirely encapsulated by a plurality of vacuum housings 109 connected to each other in a gas-proof manner. Thus, the reflective optical elements A to E are protected from components (not shown) outgasing contaminating substances to the interior space of the housing 107A of the projection system 107. For the purpose of reducing the partial pressure of contaminants inside the vacuum housings 109, a purge unit 111 is provided for generating a purge gas flow to two openings of the vacuum housings 109 used as an entrance and exit for the beam path 108B, being located close to the first and second cryogenic panel 124A, 123A. These openings (not shown) may be designed as described with respect to FIG. 9, i.e. may have a shape which prevents diffusion of contaminating substances to the inside of the vacuum housing.

Similarly as for the projection system 107, a plurality of vacuum housings 110 of an illumination system is arranged between the reticle 106A and an EUV light source (not shown) with a beam shaping unit (not shown) to protect the surfaces of four further reflective optical elements, one of which (105A) is shown in FIG. 10, from contaminating particles inside of a housing (not shown) of the EUV projection exposure apparatus 1'.

In the example shown in FIG. 10, the two pluralities of vacuum housings 109, 110 encapsulate the beam path between the reflective optical elements (mirrors) of the projection system 107 and of the illumination system, respectively. The only reflective surface which is not protected by the vacuum housings is that of the reticle 106A, as in general a load lock is provided for changing the reticle 106A when imaging of a different structure is required, so that cleaning of the reticle may be performed outside of the EUV projection exposure apparatus 1'.

In the arrangements shown in FIG. 1 to FIG. 4 and FIG. 9 as well as FIG. 10, in the most favorable case, in the immediate surroundings of the mirrors the partial pressures of the contamination (e.g. hydrocarbons or water) can be reduced to less than $10^{-13}$ mbar, in particular in the case of a purged mini-environment). Furthermore, the selection of material and equipment suitable for EUV for use in the housing 2 involves reduced expenditure. It is understood that the approach described above is not limited to EUV projection exposure apparatuses but can be used to advantage with any optical arrangement having varying numbers and shapes of optical elements, in particular in the case of optics with reflective optical elements, for example EUV optics.

Apart from contamination reduction provided by measures on the projection exposure apparatus 1, contamination-reducing measures can also be undertaken on the optical elements themselves, as will be explained in more detail below. FIG. 5 shows an optical element 40 for the projection exposure apparatuses shown in FIG. 1 to FIG. 3. This optical element 40 has a substrate 41 and a multilayer system 42 with an optical surface 44 that is exposed to contaminating substances. In order to prevent the deposit of said contaminating substances on the optical surface 44 to the greatest extent possible, a ring 43 of ruthenium is arranged around the optical surface 44 or around the multilayer system 42, which provides good adsorption in particular of metals and metal compounds, e.g. tin- and zinc compounds, as well as hydrocarbons as contaminating substances.

Contaminating substances that are present on the optical surface 44 carry out a thermal non-directional movement. As soon as they reach the edge of the optical surface 44 they adhere to the adsorbent material, as a result of which the contamination of the optical surface 44 can be reduced. In order to reinforce this effect it is favorable to heat the optical surface 44, for which purpose a heater 45 is embedded in the substrate 41 of the optical element 40 shown in FIG. 5. This heater 45 produces an increase in the temperature of the optical surface 44, which increase in temperature triggers increased movement of the molecules or atoms of the contaminating substances so that the substances move along faster and reach the edge of the optical surface 44 in a shorter period of time. By increasing the temperature of the optical surface 44 in comparison to the adsorbent material 43, a temperature gradient and consequently additionally a convective flow towards the adsorbent material is generated. As an alternative or in addition, the temperature of the adsorbent material can be reduced with a cooling unit.

Figure 8:
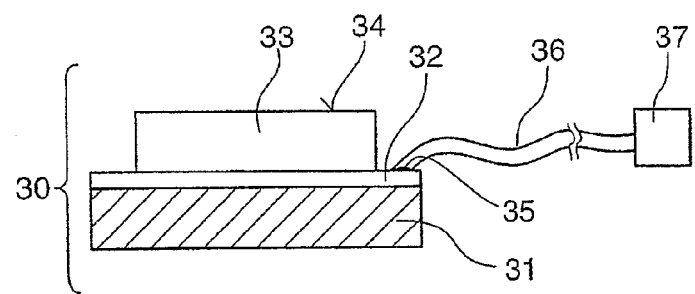
FIG. 8 an optical arrangement having a reflective optical element that has a contactable electrically conductive layer.

FIG. 8 shows a further reflective optical element 30 for EUV lithography, which element 30 has a substrate 31 of low electrical conductivity, and an electrically conductive multilayer system 33 which on a side opposite the substrate 31 includes a reflective optical surface 34.

The illumination radiation in EUV optics usually generates photoelectrons, in particular secondary electrons, on the optical surfaces, which can lead to electrical charging and consequently to the deposit of charged or polarisable particles. For this reason, in the optical element 30 an electrically conductive layer 32, arranged between the substrate 31 and the multilayer system 33, for leading away a photocurrent, for earthing, or for applying a defined voltage is provided so that it is electrically contactable. For this purpose the substrate 31 with the layer 32 protrudes in an edge region of the multilayer system 33, in which a solder point or adhesive point 35 as a contact for connecting the layer 32 to a line 36 has been applied. In the present case the electrically conductive layer 32 includes nickel and is approximately 20 nm in thickness. As an alternative the layer 32 could also include gold or some other suitable material of adequate thickness, in particular a multilayer system. By applying a defined voltage or mass potential the charges can be led away from the optical surface 34 without the latter having to be contacted directly.

In FIG. 8 the line 36 is connected to a current- or voltage measuring device 37 which is used for measuring the photocurrent, which allows conclusions to be drawn regarding the degree of contamination of the optical surface 34. In order to measure the photocurrent, the line 36 is provided with suitable shielding so that measuring the photocurrent at a frequency of more than 1 kHz, corresponding to the pulse frequency of an EUV projection illumination instrument, can be carried out. In this arrangement the line 36 leads the sensor current out of an evacuated housing in which the optical element 30 is normally arranged.

By applying an additional electrically conductive and contactable layer 32 there is no need to directly contact the optical surface 34, so that deformation or degradation of its optical characteristics can be avoided. Of course the layer 32 can also be contacted in a way that differs from the way described above, e.g. in that an electrical contact is embedded in the substrate 31.

The measures carried out in FIG. 5 and FIG. 8 on the optical elements 40 or 30 can also be carried out in combination on a single optical element. The optical elements 40 and 30 described above can advantageously be used in projection exposure apparatus for microlithography, as shown for example in FIG. 1 to FIG. 3, or in other EUV optics.

The invention claimed is:

1. A projection exposure apparatus for EUV lithography wherein a radiation exposure operation is conducted, the projection exposure apparatus comprising:
    a main housing that encloses an interior space into which contaminating substances are outgassed during said operation;
    said main housing including three interconnected housing parts in said interior space of said main housing; a first one of said housing parts including a first interior space; a second one of said housing parts including a second interior space; and, a third housing part including a third interior space;
    said first housing part enclosing a light source in said first interior space;
    said second housing part enclosing an illumination system in said second interior space;
    said third housing part enclosing a projection optics system in said third interior space;
    at least one optical element arranged in one of said housing parts and said one optical element having an optical surface;
    a vacuum generating unit that generates a vacuum in the interior space of said one housing part of said main housing so as to cause the contaminating substances therein to be at a first partial pressure;
    a vacuum housing that is arranged in the interior space of said one housing part so as to be independent thereof;
    said vacuum housing enclosing at least said optical surface of said optical element so as to leave a first opening communicating with said interior space of said main housing or into the interior space of another one of said housing parts;
    a light source that directs light onto said optical surface during the radiation exposure operation to form a beam of exposure light traveling along a beam path from said optical surface within said vacuum housing through said first opening into said interior space of said main housing or into the interior space of another one of said housing parts; and,
    a contamination reduction unit associated with said vacuum housing and, during the radiation exposure operation, reducing the partial pressure of the contaminating substances at least in proximity to said optical surface to a second partial pressure of the contaminating substances less than said first partial pressure in the interior space of said one housing part;
    said contamination reduction unit further comprising a purge unit that purges at least a partial region of said vacuum housing with an inert gas; and,
    a second opening in said vacuum housing defining a suction unit for generating a flow of purge gas from the inside of said vacuum housing to the interior space of said one housing part.

2. The projection exposure apparatus of claim 1, wherein said beam of exposure light passes from said vacuum housing into said interior space of said main housing only through said first opening.

3. The projection exposure apparatus according to claim 1, further comprising at least one cleaning head configured to direct a jet of a cleaning gas to the optical surface that removes contaminating substances from the optical surface.

4. The projection exposure apparatus according to claim 3, wherein the cleaning head comprises an activation unit that generates the jet of cleaning gas by at least partially activating a flow of purge gas.

5. The projection exposure apparatus according to claim 4, wherein the activation unit comprises a heated filament.

6. The projection exposure apparatus according to claim 3, wherein an interior of the vacuum housing comprises only materials that do not generate outgasing products induced by the cleaning gas.

7. The projection exposure apparatus according to claim 1, wherein the vacuum housing, on at least one interior partial region, comprises a material with a low atomic hydrogen recombination rate.

8. The projection exposure apparatus according to claim 1, further comprising a measuring unit that measures a contamination status of the optical surface arranged inside the vacuum housing.

9. The projection exposure apparatus according to claim 1, wherein the vacuum housing and the optical element are temperature-resistant up to a baking temperature of at least 100° C.

10. The projection exposure apparatus according to claim 9, further comprising at least one heating unit heating the at least one vacuum housing to the baking temperature.

11. The projection exposure apparatus according to claim 1, wherein the contamination reduction unit generates at least one of a partial pressure of water of less than $10^{-7}$ mbar and a partial pressure of hydrocarbons of less than $10^{-9}$ mbar at the optical surface.

12. The projection exposure apparatus according to claim 1, wherein the contamination reduction unit generates a partial pressure of the contaminating substances of less than $10^{-9}$ mbar.

13. The projection exposure apparatus according to claim 1, wherein the contamination reduction unit comprises at least one suction unit that removes, by suction, contaminating substances from the vacuum housing.

14. The projection exposure apparatus according to claim 13, wherein the suction unit generates a pressure gradient essentially parallel to the optical surface in the vacuum housing.

15. The projection exposure apparatus according to claim 1, wherein the vacuum housing is connected to at least one of a further vacuum housing and a remaining portion of the interior space of the housing that encloses the interior space.

16. The projection exposure apparatus according to claim 1, wherein the optical surface of the optical element is arranged in a beam path that extends in the housing that encloses the interior space and extends through an opening in the vacuum housing.

17. The projection exposure apparatus according to claim 16, wherein the vacuum housing envelopes the beam path.

18. The projection exposure apparatus according to claim 1, wherein the entire beam path extending in the housing that encloses the interior space is essentially completely separated from a remaining portion of the interior space of the housing that encloses the interior space by at least two vacuum housings that are connected together in a gas-proof manner.

19. The projection exposure apparatus according to claim 1, wherein the vacuum housing encloses at least the optical surfaces of two optical elements.

20. The projection exposure apparatus according to claim 1, wherein the contamination reduction unit comprises a cooling unit that cools the vacuum housing to a temperature of less than 290 K.

21. The projection exposure apparatus according to claim 1, wherein the vacuum housing comprises the contamination reduction unit, and at least in one partial interior region of the vacuum housing comprises a gas-binding material.

22. The projection exposure apparatus according to claim 1, further comprising at least one component arranged in the interior space that outgases at least one of contaminating particles and molecules, and wherein the contamination reduction unit comprises a suction unit which, by suction, removes from the interior space of the housing the particles outgased by the component.

23. The projection exposure apparatus according to claim 22, wherein the component is affixed on a substrate or on a holding device of the optical element.

24. The projection exposure apparatus according to claim 1, further comprising at least one reflective optical element that comprises:
 a substrate,
 an electrically conductive multilayer system which, on a side opposite the substrate, comprises a reflective optical surface, and
 an electrically conductive layer, arranged between the substrate and the multilayer system, which is electrically contacted for leading away a photo current, for earthing, or for applying a defined voltage.

25. The projection exposure apparatus according to claim 24, wherein the electrically conductive layer is connected to at least one of the mass potential and a current- or voltage measuring device.

26. The projection exposure apparatus according to claim 25, wherein the electrically conductive layer is connected by a line and the line is adapted for measuring the photocurrent at a frequency of more than 1 kHz.

27. A projection exposure apparatus for EUV lithography, comprising:
 a first vacuum housing enclosing a first interior space;
 at least one optical element arranged in said first vacuum housing and said optical element having an optical surface;
 a vacuum generating unit generating a vacuum in said first interior space of said first vacuum housing;
 a second vacuum housing arranged in said first interior space of said first vacuum housing and said second vacuum housing enclosing a second interior space separate from said first interior space;
 said optical surface of said optical element being disposed within said second interior space;
 said second vacuum housing being independent of said first vacuum housing and having a first outlet opening into said first interior space;
 a light source for directing light onto said optical surface during a radiation exposure operation to form a beam of exposure light traveling from said optical surface and passing from within said second vacuum housing through said first outlet thereof into said first interior space not enclosed by said second vacuum housing;
 a contamination reduction unit associated with said second vacuum housing and, during said radiation exposure operation, reducing a partial pressure of contaminating substances at least in proximity to said optical surface in relation to a partial pressure of the contaminating substances in portions of said first interior space of said first vacuum housing not enclosed by said second vacuum housing;
 said contamination reduction unit further comprising a purge unit that purges at least a partial region of said second vacuum housing with an inert gas; and,
 a second outlet in said second vacuum housing defining a suction unit for generating a flow of purge gas from the inside of said second vacuum housing to said first interior space.

28. The projection exposure apparatus of claim 27, wherein said beam of exposure light passes from said second vacuum housing into said first interior space only through said first outlet.

29. The projection exposure apparatus according to claim 27, wherein the purge unit generates a purge-gas pressure of between $10^{-3}$ mbar and 10 mbar.

30. The projection exposure apparatus according to claim 27, wherein the light travels along a beam path section from the light source to the optical surface and along a further beam path section from the optical surface to a further optical surface, and wherein the vacuum housing entirely encloses the beam path section and the further beam path section.

31. The projection exposure apparatus according to claim 30, further comprising a further contamination reduction unit, and wherein each of the optical surfaces is associated with only a respective one of the contamination reduction units.

32. The projection exposure apparatus according to claim 27, further comprising a third vacuum housing and at least one further optical surface, and wherein each of the optical surfaces is enclosed only by a respective one of said second and third vacuum housings.

33. The projection exposure apparatus according to claim 32, wherein each of said second and third vacuum housings encloses no more than two optical surfaces.

34. The projection exposure apparatus according to claim 33, wherein each of said second and third vacuum housings is provided with a respective contamination reduction unit.

* * * * *

UNITED STATES PATENT AND TRADEMARK OFFICE
CERTIFICATE OF CORRECTION

PATENT NO. : 8,382,301 B2
APPLICATION NO. : 12/403233
DATED : February 26, 2013
INVENTOR(S) : Dirk Heinrich Ehm et al.

Page 1 of 1

It is certified that error appears in the above-identified patent and that said Letters Patent is hereby corrected as shown below:

In the Specifications

Column 7:

Line 24: delete "$10^{11}$ mbar" and substitute -- $10^{-11}$ mbar -- therefor.

Signed and Sealed this
Twenty-eighth Day of May, 2013

Teresa Stanek Rea
*Acting Director of the United States Patent and Trademark Office*